United States Patent
Li et al.

(10) Patent No.: US 7,673,221 B2
(45) Date of Patent: Mar. 2, 2010

(54) OPTIMAL BIT ALLOCATION SYSTEM FOR REED-SOLOMON CODED DATA

(75) Inventors: Bin Li, Ottawa (CA); Alberto Ginesi, Nepean (CA); Song Zhang, Kanata (CA)

(73) Assignee: Ciena Corporation, Linthicum, MD (US)

( * ) Notice: Subject to any disclaimer, the term of this patent is extended or adjusted under 35 U.S.C. 154(b) by 2618 days.

(21) Appl. No.: 10/046,639

(22) Filed: Oct. 26, 2001

(65) Prior Publication Data
US 2002/0140991 A1 Oct. 3, 2002

(30) Foreign Application Priority Data
Oct. 26, 2000 (CA) .................................. 2324574

(51) Int. Cl.
*H03M 13/00* (2006.01)

(52) U.S. Cl. .................. 714/774; 714/704; 714/758; 714/759

(58) Field of Classification Search .............. 714/704, 714/759, 779, 758, 774
See application file for complete search history.

(56) References Cited

U.S. PATENT DOCUMENTS

| 5,600,663 | A | 2/1997 | Ayanoglu et al. | |
| 5,699,369 | A | 12/1997 | Guha | |
| 5,737,337 | A | 4/1998 | Voith et al. | |
| 5,987,061 | A * | 11/1999 | Chen | 375/222 |
| 6,072,990 | A | 6/2000 | Agrawal et al. | |
| 6,310,909 | B1 * | 10/2001 | Jones | 375/220 |
| 6,330,700 | B1 | 12/2001 | Morris et al. | |
| 6,598,188 | B1 * | 7/2003 | Locke et al. | 714/704 |

* cited by examiner

*Primary Examiner*—Sam Rizk
(74) *Attorney, Agent, or Firm*—Merek, Blackmon & Voorhees, LLC

(57) ABSTRACT

Apparatus and method for generating parameters used in coding data in a data transmission system. The method determines a number of possible coding parameters to satisfy a target coding gain and selects the best set of parameters that balance the code word length and the error rate. In this manner, a minimum coding gain may be used, which minimizes cross-talk on a transmission link.

24 Claims, 6 Drawing Sheets

OPTIMAL BIT ALLOCATION SYSTEM FOR REED-SOLOMON CODED DATA

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention relates generally to a method and apparatus for providing a forward error correction scheme for data transmission and specifically to an improved method for selecting error correction parameters.

The increasing volume of information communicated electronically has taxed the capacity of the communications infrastructure. One form of high-speed communication is Digital Subscriber Line (DSL) technology. DSL uses an infrastructure that already exists; namely, copper twisted pair lines typically used for telephone communication. However, only a small portion of the available bandwidth of the twisted pair line (0 to 4 kHz) is used for Plain Old Telephone Service (POTS). DSL takes advantage of the available frequency spectrum from 4 kHz to approximately 1.1 MHz for transmitting data over relatively short reaches.

Asymmetric DSL (ADSL) is the most widely implemented form of DSL technology. ADSL is asymmetric in that its downstream (to a subscriber) capacity is larger than its upstream (from the subscriber) capacity. Typically, a Discrete Multi-Tone (DMT) scheme is used. The spectrum from 4 kHz to 1.1 MHz is divided into 256 sub-channels, or tones, each having a bandwidth of 4.3125 kHz.

It is well known that the performance of an ADSL modem is generally limited by cross-talk. In order to improve system performance and capacity, an error-correcting code such as the Reed-Solomon (RS) code is used. Using error-correcting codes, a higher data rate or longer loop reach can be achieved for the same level of transmitted signal power. However, this can be optimized only by selecting appropriate error-correcting code parameters, such as code-word length (n) and redundant, or parity, length (r).

If large values are selected for the code-word length n and redundant length r, large coding gain can be achieved from error-correcting codes. However, a large value for r will have a large overhead loss. This leads to a trade-off in the choice of the value for r. Further, the selection of error-correcting code parameters depends on the transmission environment such as signal-to-noise ratio (SNR) distribution over multiple DMT tones. Thus, in practice the selection of the best possible error-correcting code parameters is very difficult.

Furthermore, this difficulty is not confined to DSL, but also applies to other communications technologies, such as cable modems, CD and DVD players, digital audio and broadcast, HDTV/Digital TV, data storage, wireless communications, wireless enabled personal digital assistants, digital satellite communication and broadcast, and Redundant Array of Independent Disk (RAID) controllers with fault tolerance.

It is an object of the present invention to obviate or mitigate the above-mentioned difficulties.

BRIEF SUMMARY OF THE INVENTION

According to an embodiment of the invention, in a data communication system an iterative method is provided for dynamically determining parameters for a forward error correction (FEC) coding scheme for optimizing data transmission in a specific environment. A specific method comprises the steps of establishing a relationship between the FEC parameters and a coding gain; initializing the coding gain to a minimum predetermined value; using the relationship between the parameters and the coding gain to determine an intermediate set of parameters for providing a preferred result for the coding gain; incrementing the value of the coding gain by a predetermined amount; repeating the previous steps until the coding gain reaches a predefined maximum value; and determining a preferred set of parameters from the intermediate sets of parameters, wherein the preferred set of parameters provides the forward error correction scheme with an optimal set of values for balancing code length and error rate. In a specific embodiment a Reed-Solomon code is employed.

The invention will be better understood by reference to the following detailed description in connection with the following drawings.

BRIEF DESCRIPTION OF THE DRAWINGS

An embodiment of the present invention will now be described by way of example only with reference to the following drawings in which.

DETAILED DESCRIPTION OF THE INVENTION

Figure 1:
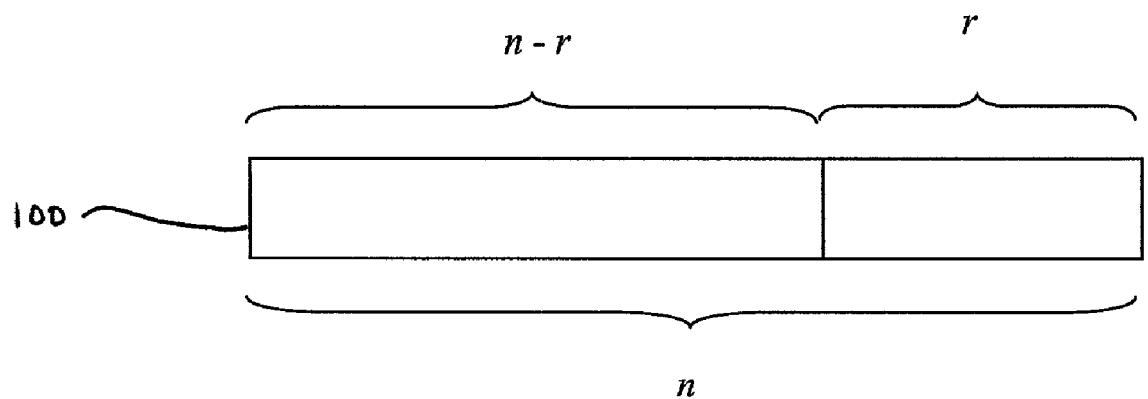
FIG. 1 is a block diagram of a Reed-Solomon code word.

Referring to FIG. 1, a block diagram of a code word is illustrated generally by numeral 100. In the present invention, a Reed-Solomon (RS) code is specified as RS (n,r), where n is the code length (also referred to as the size) of the code word, in symbols, and r is a number of redundant symbols in the code word. Therefore, the total number of information symbols is n-r. In the present embodiment, each symbol comprises eight bits, so the terms parity symbol and parity byte, and information symbol and information byte, may be used interchangeably. Further, for an eight-bits/symbol system, the maximum code word size is $2^8-1=255$. An RS decoder can correct up to t symbols that contain errors in a code word, where $2t=r$.

The probability of an error remaining in decoded data is typically much lower where RS codes are used. Therefore, for two systems transmitting at the same power, a communication system using RS codes can transmit data of a selected bit error rate farther than a system that does not employ RS codes. The term "coding gain" refers to the difference in power that the non-error correcting system would require to transmit data of a specified bit error rate as compared to the power required by the error correcting system.

The following describes a bit allocation process for RS coded data. The process determines the RS code that best maximizes the transmitted data rate and minimizes the transmitted power. Other constraints, such as impulse noise protection and maximum latency, are included as well.

Figure 2:
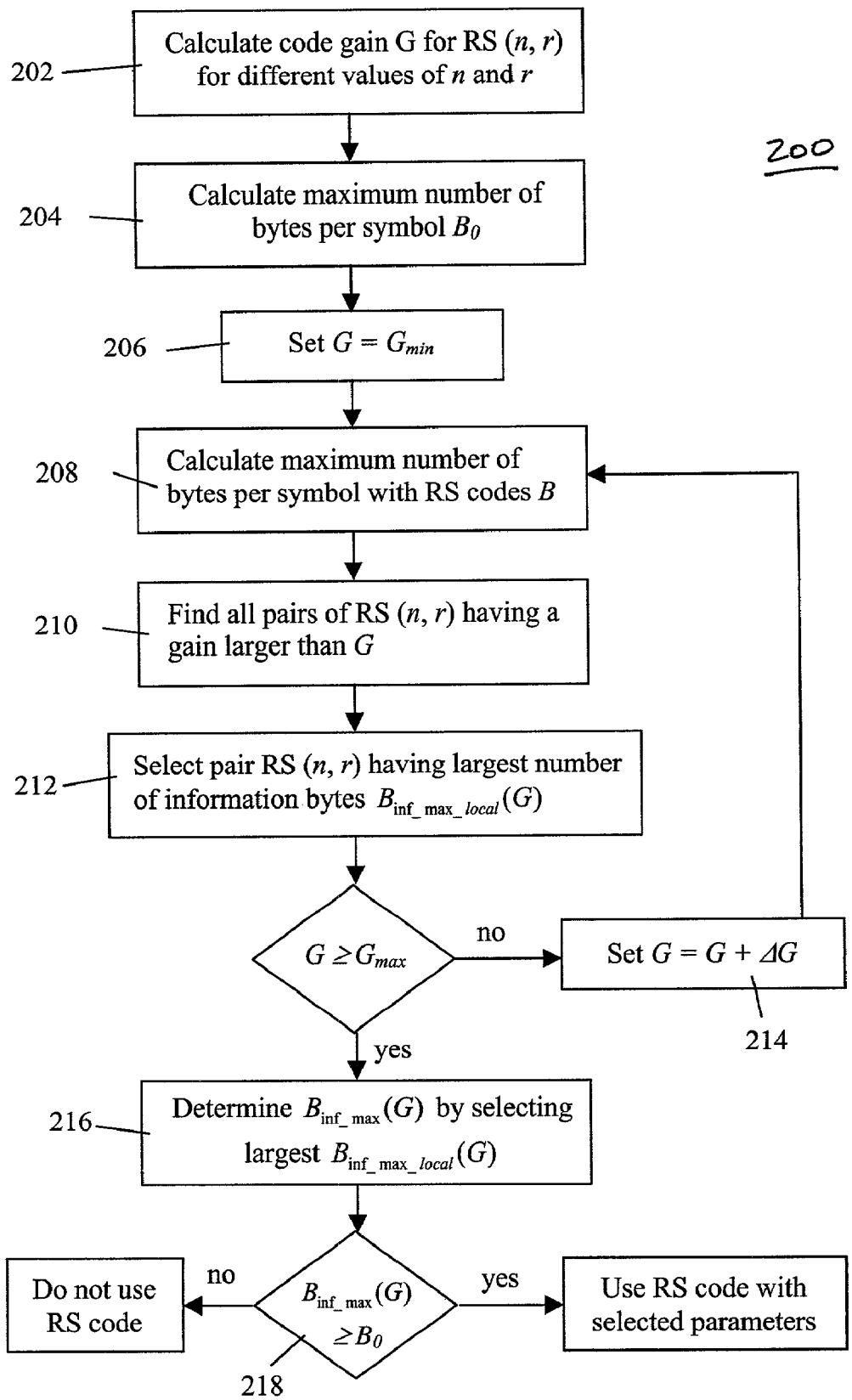
FIG. 2 is a flowchart illustrating a bit allocation scheme.

Referring to FIG. 2, a flowchart illustrating the steps of the process is illustrated generally by numeral 200. At step 202, a gross coding gain G of the RS code is pre-calculated for different values of code-word length n and redundant length r. A relationship between the gain G, the code word length n, and the redundant length r is established and recorded. The relationship is recorded either as a table or represented by a mathematical expression, such as a polynomial approximation. If a table is used for representing the relationship, the row/column entries are code word length n and redundant length r, and the table content is the gross coding gain of the RS code for the associated code word length n and redundant length r. If a polynomial expression is used for representing the relationship, the gross coding gain can be calculated as a function of the code word length n and redundant length r.

At step 204, a total number of bits that can be transmitted over all DMT tones for one DMT symbol when RS code is not used is calculated using the following equation:

$$b_0 = \sum_{k=1}^{M} \log_2\left(1 + \frac{SNR_k}{\Gamma \cdot \gamma}\right) \quad (1)$$

In Equation (1), $SNR_k$ is a signal-to-noise ratio (SNR) for a $k^{th}$ tone, $\Gamma$ is an energy gap associated with quadrature amplitude modulation (QAM) and a required bit error rate (BER), $\gamma$ is a required margin for guaranteeing a BER performance with some noise tolerance, and M is the number of DMT tones used over one DMT symbol. A total number of bytes $B_0$ that can be transmitted over one DMT symbol is calculated as the highest multiple of 8 that is lower than $b_0$ by taking $B_0=b_0$(div 8).

At step 206, the gross coding gain G is initialized as $G=G_{min}$, where $G_{min}$ is the minimum desired gross coding gain for all possible values of the code word length n and the parity length r.

Then, at step 208, in accordance with the gross coding gain G, a total number of bits b that can be transmitted over all tones of one DMT symbol is calculated using the following equation:

$$b = \sum_{k=1}^{M} \log_2\left(1 + \frac{SNR_k}{\Gamma \cdot \gamma/G}\right) \quad (2)$$

A total number of bytes B that can be transmitted over one DMT symbol is calculated as the highest multiple of 8 that is lower than b by taking B=b (div 8). For the present embodiment, only the integer portion of b divided by B is used because for G.992.1 and G.992.2 compliant modems, the number of bits that a DMT symbol can carry is restricted to a multiple of eight. Thus, the DMT symbol can carry an integer number of bytes.

At step 210, all code pairs RS (n, r) that can provide a gross coding gain not less than G are found and stored. The code word n is transmitted over S symbols, where n=BS. In accordance with ADSL G.lite and G.dmt standards, the number of symbols S comprises the set $S \in \{1,2,4,8,16\}$). In accordance with the ADSL G.lite standard, the number of redundant bytes r comprises the set $r \in \{4,8,16\}$. In accordance with the ADSL G.dmt standard, the number of redundant bytes is r, where $r \in \{2,4,6,8,10,12,14,16\}$). The number of redundant bytes r is divisible by the number of symbols S, such that r modulo S=0. As all possible combinations of r and S in the available set might not result in an integer for r modulo S, these values are discarded by the process, because they would result in a non-integer number of bytes per DMT symbol.

For different values of the code word length n=BS and redundant length r, the gross coding gain is obtained either by look-up table or by mathematical calculation. The table or mathematical function is obtained from step 202. For each code pair RS (n, r) providing a gross coding gain not less than G, a number of information bytes per symbol $B_{inf}(G)$ is calculated as $B_{inf}(G)=B-r/S$. In step 212, the code pair RS (n, r) having the largest number of information bytes per symbol $B_{inf}(G)$ available is selected as the best code pair $B_{inf\_max\_local}(G)$. Note that the best code pair $B_{inf\_max\_local}(G)$ for each iteration has a corresponding gross coding gain G and code pair RS (n, r). The values for G, $B_{inf\_max\_local}(G)$ and the pair RS (n, r) are stored in a memory.

If other (external) factors such as a delay or impulse noise protection requirements are considered, the selection of S and r is limited by those factors. For example, if protection against an error burst longer than P bytes is desired, the constraint to be used is r*D/2>P, where D is an interleaver depth of an inner interleaver associated with the RS code. If a maximum latency of the system is to be less than $L_{max}$ ms, then the constraint to be used is $$x + \frac{(S-1)}{4} + \frac{S \cdot D}{4} < L_{max}$$

where x is a constant system delay in milliseconds. Modifications of this nature in the selection of S and r are known, and their use in the present invention will be apparent to a person skilled in the art.

At step 214, the value of the gross coding gain G is incremented by $\Delta G$. Steps 208 through 212 are repeated until the gross coding gain G is greater than or equal to a maximum gross coding gain value $G_{max}$. The maximum gross coding gain $G_{max}$ is the maximum gross coding gain for all possible values of the code word length n and redundant length r.

At step 216, once the gross coding gain has equaled or exceeded the maximum gross coding gain $G_{max}$, the largest value for the number of information bytes per symbol $B_{inf}(G)$ is found for all values of G. That is, for all values of the gross coding gain G from $G_{min}$ to $G_{max}$ with step size $\Delta G$, the values of $B_{inf\_max\_local}(G)$ are compared. The code pair RS (n, r) having the largest number of information bytes per symbol $B_{inf\_max}$ associated with it is selected. The largest number of bytes per symbol $B_{inf\_max}$ for a gross coding gain between $G_{min}$ and $G_{max}$ is the maximum number of information bytes that can be transmitted over one DMT symbol, and its associated code pair RS (n, r) are the best parameters to support it.

A final step 218 compares the largest number of bytes per symbol $B_{inf\_max}$ with the maximum number of bytes per symbol $B_0$ had the RS code not been used. This comparison ensures that the RS code improves the capacity of the transmission. If the largest number of bytes per symbol $B_{inf\_max}$ is less than $B_0$, then the RS code should not be used.

In an alternate embodiment, trellis-coded modulation (TCM) is used over all tones of one DMT symbol. The pre-calculated gross coding gain is the gross coding gain of the RS code over TCM QAM, not conventional QAM. Therefore, the coding gain from TCM needs to be included in the calculation of number of bits per DMT symbol in Equations (1) and (2). It should be noted that the table for RS coding over QAM differs from the table to be used for RS coding over TCM-QAM. Therefore, a new table is computed and stored as required.

Using Equations (1) and (2) to calculate the number of bits over one DMT symbol can be complicated. Therefore, in an alternate embodiment, the SNR thresholds (with or without coding gain) are pre-calculated for different QAM sizes. The SNR for each tone is quantized to determine the number of bits to be transmitted with a minimum change in power on the tone while maintaining an average power for all tones that does not increase.

The use of SNR thresholds to determine the number of bits to be transferred is known in the art and, therefore, will not be discussed in great detail. Generally, in order to determine a number of bits ($b_i$) that a bin with a given SNR can support, the SNR in the bin is compared with 15 thresholds. Each of the thresholds represents a constellation size up to 15 bits per constellation. The number of bits $b_i$ is set to be the constellation size (that is, the number of bits carried in that constellation) whose SNR threshold is closest to the bin SNR. The thresholds are computed in accordance with the following equation:

$$SNR_{Thresh}(b) = \frac{(2^b - 1)\Gamma\gamma}{G} \quad b = 1, 2, \ldots, 15$$

Figure 3:
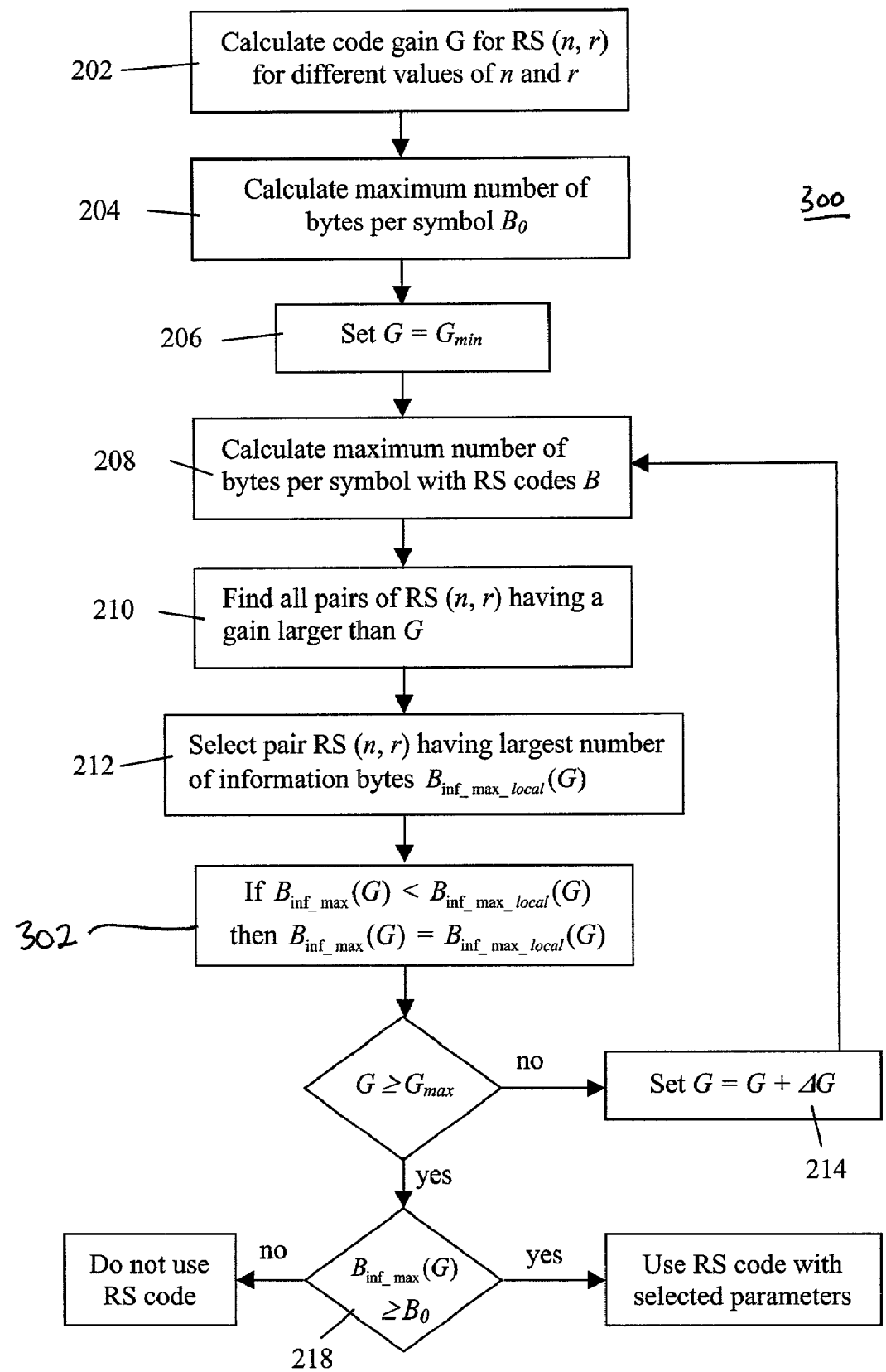
FIG. 3 is a flowchart illustrating an alternate bit allocation scheme.

Referring to FIG. 3, a flowchart for yet another alternate embodiment is illustrated generally by numeral 300. Searching for the final optimal solution, that is, $B_{inf\_max}$ and its associated parameters, is implemented differently than in previous embodiments. Rather than storing each maximum number of information bytes per symbol $B_{inf}$ for different values of G and then comparing all stored numbers once the value of $G_{max}$ is exceeded, $B_{inf}$ is continuously updated. That is, for example, the value of $B_{inf}$ for $G_{min}$ is stored as $B_{inf\_max}$. For each of the following iterations, $B_{inf\_max}$ is only replaced if the value of $B_{inf}$ has a greater value. The above-described procedure is performed in step 302. The other steps in the process 300 are equivalent to those in the process 200 of FIG. 2 and their details are not repeated.

Figure 4:
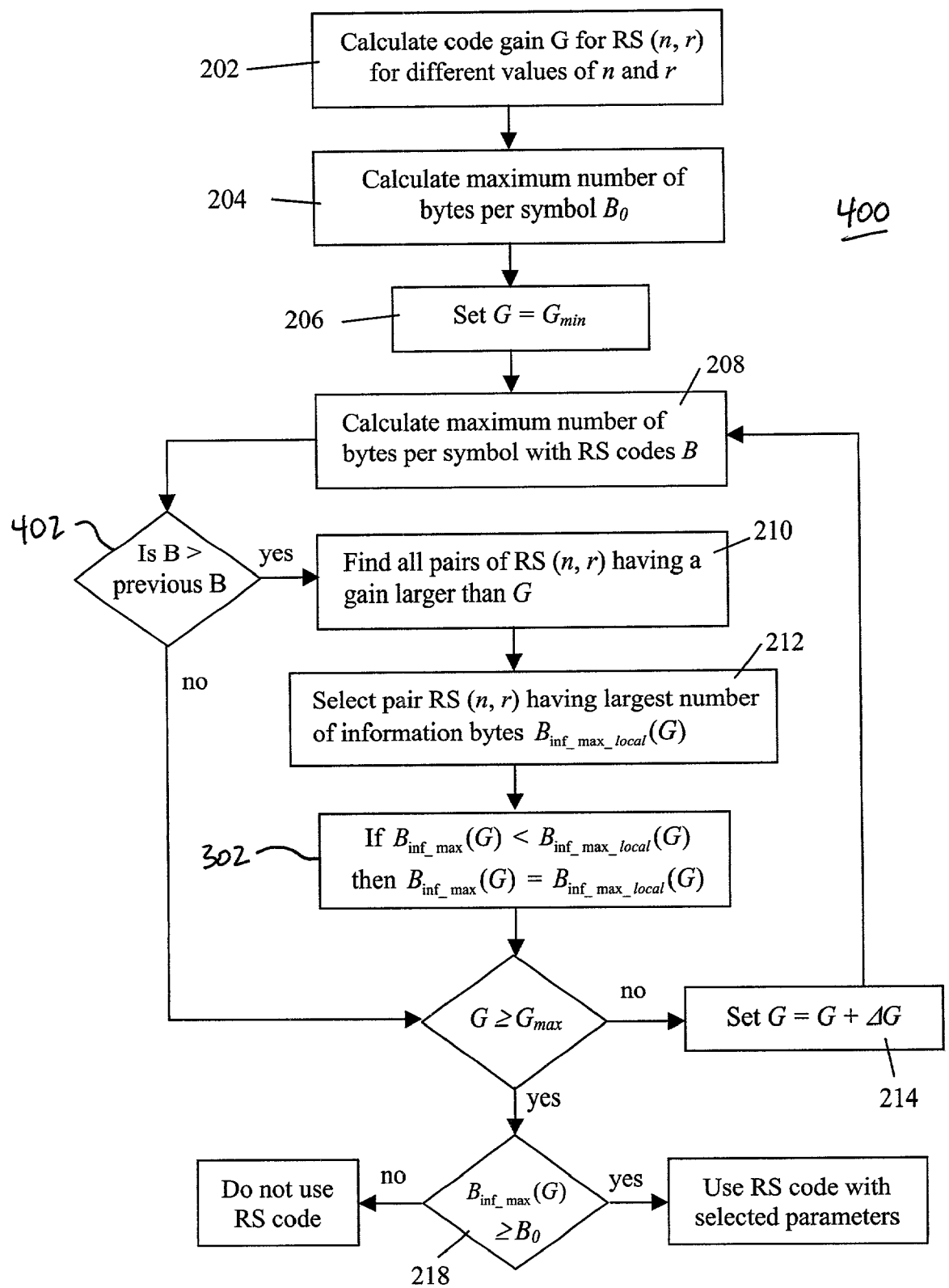
FIG. 4 is a flowchart illustrating yet an alternate bit allocation scheme.

Referring to FIG. 4, a flowchart for yet another alternate embodiment is illustrated generally by numeral 400. The speed of the process may be enhanced by checking the value of the maximum number of bits per symbol B, in step 402. If the value for B increases once the code gain G is increased, then the process proceeds as previously described. If, however, the new value for B does not increase once the code gain G is increased, the steps 210 to 212 are skipped and the value for G is incremented again. The other steps in the process 400 are equivalent to those in the process 300 of FIG. 3 and their details are not repeated.

Figure 5:
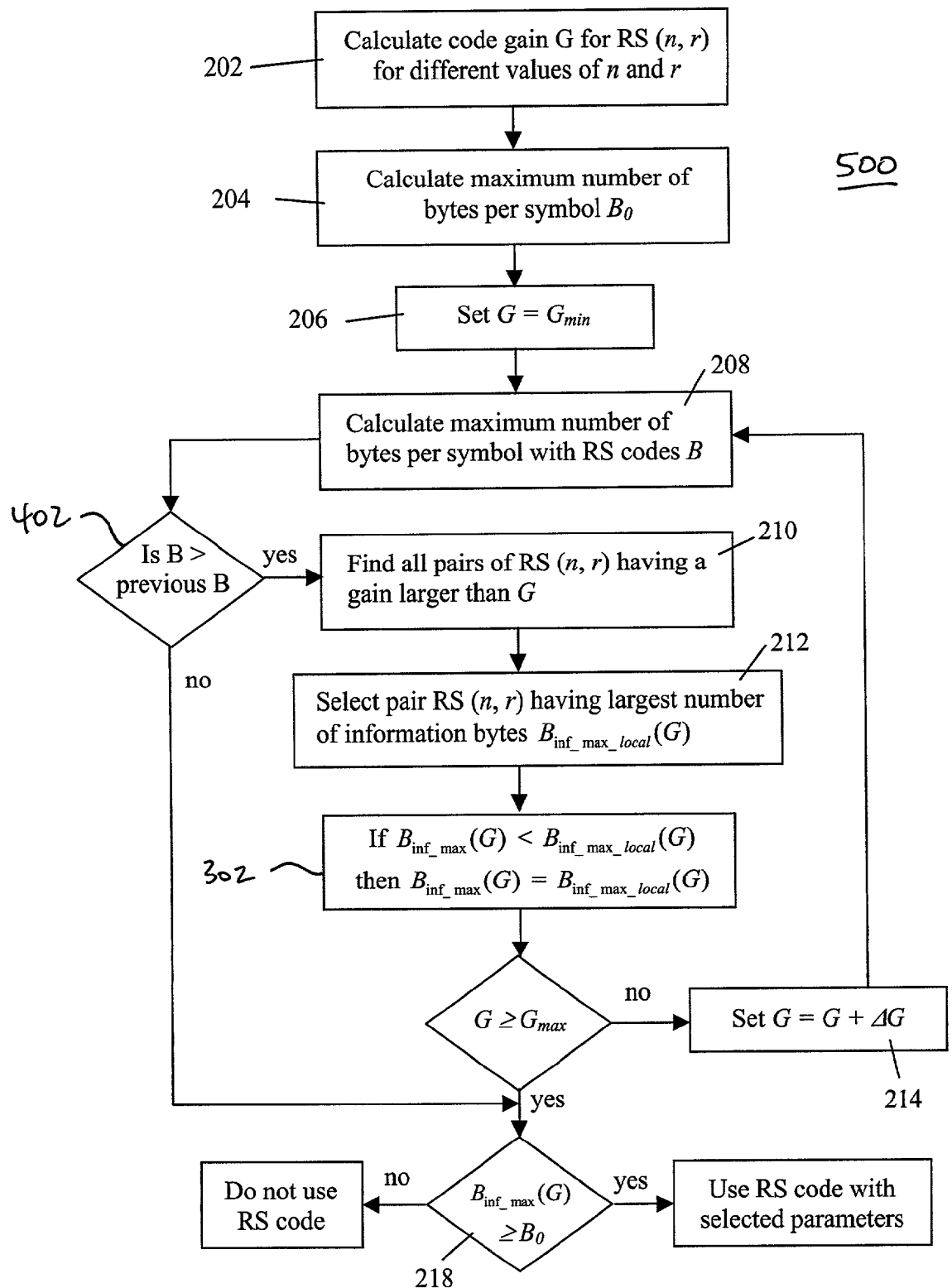
FIG. 5 is a flowchart illustrating yet an alternate bit allocation scheme.

Referring to FIG. 5, a flowchart for yet another alternate embodiment is illustrated generally by numeral 500. The speed of the process may be enhanced by stopping the iterations once a predetermined level has been reached. For example, if the maximum number of bytes per symbol $B_{inf}$ does not increase once the code gain is increased, the final optimal solution $B_{inf\_max}$ is set to higher value of $B_{inf}$ and the process is terminated. This can be seen in the process 500 by the process flowing directly from step 402 to step 218 when the condition of step 402 is not met. (Compare this with the process 400 of FIG. 4 which does not flow directly from step 402 to step 218 when the condition is not met.) The other steps in the process 500 are equivalent to those in the process 400 of FIG. 4 and their details are not repeated.

Figure 6:
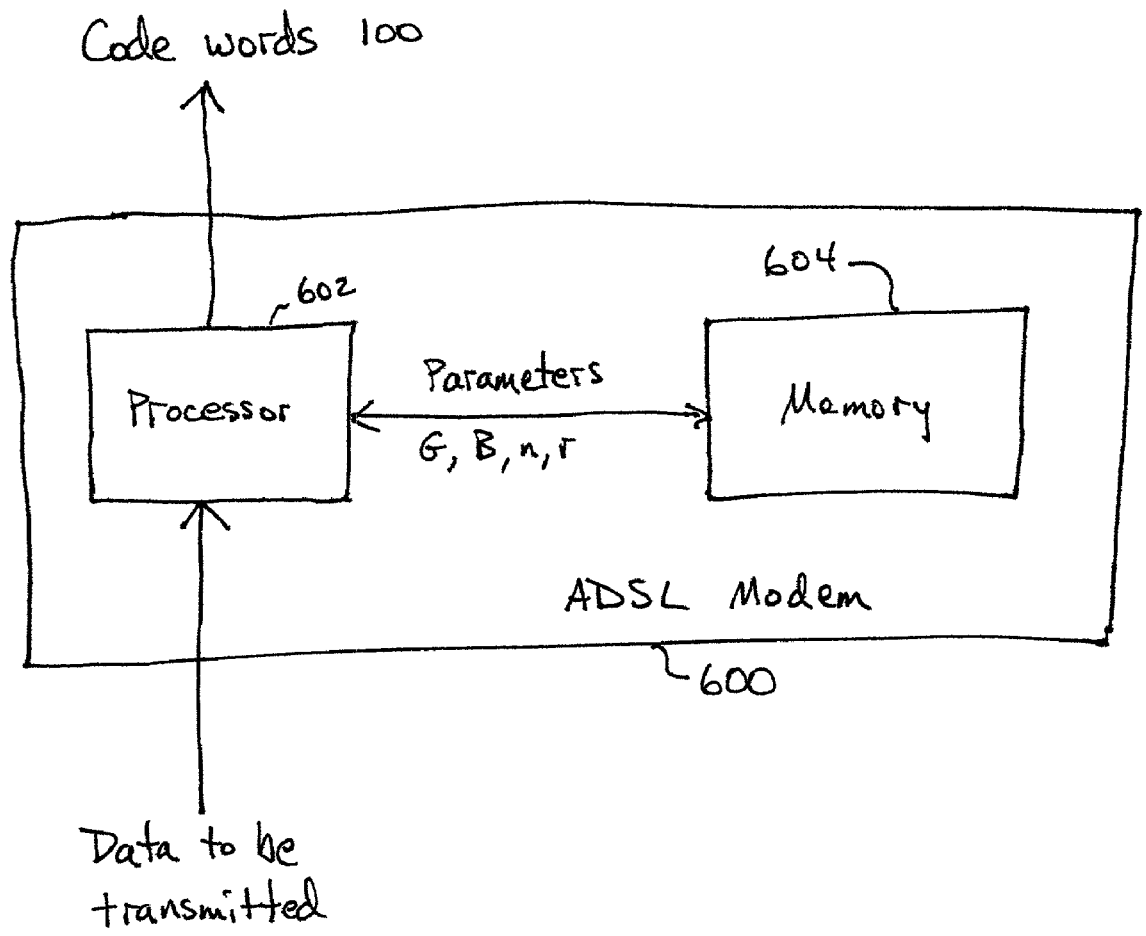
FIG. 6 is a block diagram of an ADSL modem implementing the processes of FIGS. 2-5.

FIG. 6 is a block diagram of an ADSL modem 600 that implements one or more of the above-described processes. The ADSL modem 600 includes a processor 602 and a memory 604. The memory 604 stores various data such as the parameters G, B, n and r, and the data to be transmitted. The processor 602 implements one or more of the processes 200, 300, 400 or 500. The processor 602 may also code the data to be transmitted according to the resulting preferred set of parameters and may generate code words 100 corresponding thereto.

Although the ADSL modem 600 is illustrated with the processor and memory being separate, according to another embodiment they may be together. According to another embodiment, the processor 602 may be implemented as a dedicated processor or application-specific integrated circuit that is pre-configured to perform the above-described processes. According to yet another embodiment, the processor 602 may be implemented as a more general device that executes a computer program, microcode, or other software in order to perform the above-described processes. In such a case, the computer program may be stored in the memory 604 or on some other computer-readable medium such as a floppy disk, hard drive or CD-ROM.

Although the preferred embodiments have been described with specific reference to ADSL modems, those skilled in the art will appreciate that it can be applied to other implementations of RS coding such as other DSL technologies (xDSL), cable modems, CD and DVD players; digital audio end broadcast, HDTV/Digital TV, data storage, wireless communications, wireless enabled personal digital assistants, digital satellite communication and broadcast, Redundant Array of Independent Disk (RAID) controllers with fault tolerance, and the like, without departing from the spirit and scope of the invention as outlined in the claims appended hereto.

What is claimed is:

1. An iterative method for determining parameters for a forward error correction scheme for improving the quality of a data transmission, said method comprising the steps of:
   (a) establishing a relationship between said parameters and a coding gain;
   (b) initializing said coding gain to a minimum predetermined value;
   (c) determining, based on said relationship between said parameters and said coding gain, an intermediate set of parameters for providing a preferred result for said coding gain;
   (d) incrementing a value of said coding gain by a predetermined value and repeating said step (c) until said coding gain reaches a predefined maximum value, thereby determining a plurality of intermediate sets of parameters; and
   (e) determining a preferred set of parameters from said plurality of intermediate sets of parameters, wherein said preferred set of parameters provides said forward error correction scheme with an optimal set of values for balancing a code length and an error rate of said data transmission.

2. A method as defined in claim 1, wherein said step (a) of establishing said relationship between said parameters and said coding gain comprises:

(a1) calculating said coding gain for a plurality of associated parameters; and (a2) storing results of said step (a1) in a table.

3. A method as defined in claim 1, wherein said step (a) of establishing said relationship between said parameters and said coding gain comprises:
(a1) calculating said coding gain for a plurality of associated parameters; and
(a2) determining an equation that approximates all results from said step (a1).

4. A method as defined in claim 1, wherein said step (c) of determining said intermediate set of parameters comprises:
calculating a maximum number of bytes per symbol B including said coding gain;
locating all parameters that satisfy said value of said coding gain; and
selecting, as said intermediate set of parameters, and using said maximum number of bytes per symbol B, a set of parameters that provides a best performance.

5. A method as defined in claim 4, wherein said best performance is defined by said set of parameters that yields a largest number of information bytes.

6. A method as defined in claim 1, wherein said step (e) of determining said preferred set of parameters comprises:
comparing all of said plurality of intermediate sets of parameters; and
selecting as said preferred set of parameters said intermediate set of parameters that provides a best performance.

7. A method as defined in claim 6, wherein said best performance is defined by said set of parameters that yields a largest number of information bytes.

8. A method as defined in claim 7, wherein said largest number of information bytes is compared with a maximum number of bytes $B_0$ had said forward error correction scheme not been implemented, for determining whether to use said forward error correction scheme.

9. A method as defined in claim 1, wherein said step (c) of determining said intermediate set of parameters is further based on external factors, wherein said external factors include delay and noise protection.

10. An iterative method for determining parameters for a forward error correction scheme for improving the quality of a data transmission, said method comprising the steps of:
(a) establishing a relationship between said parameters and a coding gain;
(b) initializing said coding gain to a minimum predetermined value;
(c) determining, based on said relationship between said parameters and said coding gain, an intermediate set of parameters for providing a preferred result for said coding gain;
(d) replacing a preferred set of parameters with said intermediate set of parameters if said intermediate set of parameters provides a better performance, wherein said preferred set of parameters provides said forward error correction scheme with an optimal set of values for balancing a code length and an error rate of said data transmission; and
(e) incrementing a value of said coding gain by a predetermined value and repeating said steps (c) and (d) until said coding gain reaches a predefined maximum value.

11. A method as defined in claim 10, wherein said better performance is defined as a set of parameters yielding a larger number of information bytes.

12. A method as defined in claim 10, wherein said step (c) of determining said intermediate set of parameters comprises:
calculating a maximum number of bytes per symbol B including said coding gain;
locating all parameters that satisfy said value of said coding gain; and
selecting, as said intermediate set of parameters, and using said maximum number of bytes per symbol B, a set of parameters that provides a best performance.

13. A method as defined in claim 10, wherein said step (c) of determining said intermediate set of parameters comprises:
calculating a maximum number of bytes per symbol B including said coding gain; and
selectively skipping said step (d) when a value of said maximum number of bytes per symbol B is less than or equal to a previous value of said maximum number of bytes per symbol B.

14. A method as defined in claim 10, wherein said step (c) of determining said intermediate set of parameters comprises:
calculating a maximum number of bytes per symbol B including said coding gain;
selectively skipping said steps (d) and (e) when a value of said maximum number of bytes per symbol B is less than or equal to a previous value of said maximum number of bytes per symbol B.

15. An apparatus for determining parameters for a forward error correction scheme for improving the quality of a data transmission, said apparatus including a processor to implement processing including the steps of:
(a) establishing a relationship between said parameters and a coding gain;
(b) initializing said coding gain to a minimum predetermined value;
(c) determining, based on said relationship between said parameters and said coding gain, an intermediate set of parameters for providing a preferred result for said coding gain;
(d) incrementing a value of said coding gain by a predetermined value and repeating said step (c) until said coding gain reaches a predefined maximum value, thereby determining a plurality of intermediate sets of parameters; and
(e) determining a preferred set of parameters from said plurality of intermediate sets of parameters, wherein said preferred set of parameters provides said forward error correction scheme with an optimal set of values for balancing a code length and an error rate of said data transmission.

16. An apparatus for determining parameters for a forward error correction scheme for improving the quality of a data transmission, said apparatus including a processor to implement processing including the steps of:
(a) establishing a relationship between said parameters and a coding gain;
(b) initializing said coding gain to a minimum predetermined value;
(c) determining, based on said relationship between said parameters and said coding gain, an intermediate set of parameters for providing a preferred result for said coding gain;
(d) replacing a preferred set of parameters with said intermediate set of parameters if said intermediate set of parameters provides a better performance, wherein said preferred set of parameters provides said forward error correction scheme with an optimal set of values for balancing a code length and an error rate of said data transmission; and (e) incrementing a value of said coding gain by a predetermined value and repeating said steps (c) and (d) until said coding gain reaches a predefined maximum value.

17. An apparatus as defined in claim 16, wherein said step (c) of determining said intermediate set of parameters comprises:
    calculating a maximum number of bytes per symbol B including said coding gain;
    locating all parameters that satisfy said value of said coding gain; and
    selecting, as said intermediate set of parameters, and using said maximum number of bytes per symbol B, a set of parameters that provides a best performance.

18. An apparatus as defined in claim 16, wherein said step (c) of determining said intermediate set of parameters comprises:
    calculating a maximum number of bytes per symbol B including said coding gain; and
    selectively skipping said step (d) when a value of said maximum number of bytes per symbol B is less than or equal to a previous value of said maximum number of bytes per symbol B.

19. An apparatus as defined in claim 16, wherein said step (c) of determining said intermediate set of parameters comprises:
    calculating a maximum number of bytes per symbol B including said coding gain; and
    selectively skipping said steps (d) and (e) when a value of said maximum number of bytes per symbol B is less than or equal to a previous value of said maximum number of bytes per symbol B.

20. An apparatus for determining parameters for a forward error correction scheme for improving the quality of a data transmission, comprising:
    first means for establishing a relationship between said parameters and a coding gain;
    second means for initializing said coding gain to a minimum predetermined value;
    third means for determining, based on said relationship between said parameters and said coding gain, an intermediate set of parameters for providing a preferred result for said coding gain;
    fourth means for incrementing a value of said coding gain by a predetermined value and for repeating a function of said third means until said coding gain reaches a predefined maximum value, thereby determining a plurality of intermediate sets of parameters; and
    fifth means for determining a preferred set of parameters from said plurality of intermediate sets of parameters, wherein said preferred set of parameters provides said forward error correction scheme with an optimal set of values for balancing a code length and an error rate of said data transmission.

21. An apparatus for determining parameters for a forward error correction scheme for improving the quality of a data transmission, comprising:
    first means for establishing a relationship between said parameters and a coding gain;
    second means for initializing said coding gain to a minimum predetermined value;
    third means for determining, based on said relationship between said parameters and said coding gain, an intermediate set of parameters for providing a preferred result for said coding gain;
    fourth means for replacing a preferred set of parameters with said intermediate set of parameters if said intermediate set of parameters provides a better performance, wherein said preferred set of parameters provides said forward error correction scheme with an optimal set of values for balancing a code length and an error rate of said data transmission; and
    fifth means for incrementing a value of said coding gain by a predetermined value and for repeating a function of said third means and a function of said fourth means until said coding gain reaches a predefined maximum value.

22. An apparatus as defined in claim 21, wherein said third means for determining said intermediate set of parameters comprises:
    means for calculating a maximum number of bytes per symbol B including said coding gain;
    means for locating all parameters that satisfy said value of said coding gain; and
    means for selecting, as said intermediate set of parameters, and using said maximum number of bytes per symbol B, a set of parameters that provides a best performance.

23. An apparatus as defined in claim 21, wherein said third means for determining said intermediate set of parameters comprises:
    means for calculating a maximum number of bytes per symbol B including said coding gain; and
    means for selectively skipping said function of said fourth means when a value of said maximum number of bytes per symbol B is less than or equal to a previous value of said maximum number of bytes per symbol B.

24. An apparatus as defined in claim 21, wherein said third means for determining said intermediate set of parameters comprises:
    means for calculating a maximum number of bytes per symbol B including said coding gain; and
    means for selectively skipping said function of said fourth means and a function of said fifth means when a value of said maximum number of bytes per symbol B is less than or equal to a previous value of said maximum number of bytes per symbol B.

* * * * *